United States Patent
Slavin

(10) Patent No.: US 7,350,180 B1
(45) Date of Patent: Mar. 25, 2008

(54) SEARCH ALGORITHM FOR INHERITING CLOCK CONTEXTS IN HARDWARE DESCRIPTION LANGUAGE TRANSLATION TOOLS

(76) Inventor: Keith Robert Slavin, 8474 SW. Chevy Pl., Beaverton, OR (US) 97008

( * ) Notice: Subject to any disclaimer, the term of this patent is extended or adjusted under 35 U.S.C. 154(b) by 423 days.

(21) Appl. No.: 11/228,991

(22) Filed: Sep. 17, 2005

(51) Int. Cl.
*G06F 17/50* (2006.01)

(52) U.S. Cl. ........................ 716/18; 716/1; 716/2; 716/4

(58) Field of Classification Search .................... 716/1, 716/2, 4, 6, 18; 713/323
See application file for complete search history.

(56) References Cited

U.S. PATENT DOCUMENTS

| | | |
|---|---|---|
| 5,742,180 A | 4/1998 | Dehon et al. |
| 5,812,416 A | 9/1998 | Gupta et al. |
| 5,831,864 A | 11/1998 | Raghunathan et al. |
| 6,044,211 A | 3/2000 | Jain |
| 6,152,612 A | 11/2000 | Liao et al. |
| 6,216,258 B1 | 4/2001 | Mohan et al. |
| 6,260,150 B1 * | 7/2001 | Diepstraten et al. ........ 713/323 |
| 6,397,341 B1 | 5/2002 | Genevriere |

* cited by examiner

*Primary Examiner*—Thuan Do

(57) ABSTRACT

A search algorithm supports inherited clock contexts within functions written in a Hardware Description Language. For each function, a parser generates a corresponding node tree. Each clock context node has an associated clock signal and active clock edge. The edge can be an inherited type, whereas conventionally only absolute edge types are allowed. During elaboration processing, for each clock context node encountered with an associated directly inherited edge, the algorithm searches up the node tree from the encountered node. It looks for a controlling clock context node with an associated clock signal that is connected to the encountered context's associated clock signal. If a controlling context is found, then its associated edge replaces the encountered context node's associated edge. The connection requirement supports multi-clock circuits. If necessary, the search can move up a function hierarchy. An alternative oppositely inherited edge is replaced by the opposite of the found edge.

14 Claims, 9 Drawing Sheets

Fig. 4a (4002)
```
function top_entity(input clkA, input clkB, input x, output y)
{
   clock rising clkA
      {
         clock falling clkB
            {
               y = f1(clkA, clkB, x);
            }
      }
}
```

(4004)
```
function f1(input clk1, input clk2, input in)
{
   return(two_clock(clk1, clk2, in));
}
```

(4006)
```
function two_clock(input clk1, input clk2, input in)
{
   register q1, q2;

clock inherit clk1
      {
         q1 <- in;
      }
   clock inherit opposite clk2
      {
         q2 <= q1;
      }
   return(q2);
}
```

SEARCH ALGORITHM FOR INHERITING CLOCK CONTEXTS IN HARDWARE DESCRIPTION LANGUAGE TRANSLATION TOOLS

FEDERALLY SPONSORED RESEARCH

Not applicable.

SEQUENCE LISTING OR PROGRAM

Not applicable.

BACKGROUND

1. Field of Invention

This invention relates to languages and tools for circuit design, specifically to improving tools to support increased reusability of functions written in a Hardware Description Language.

2. Prior Art

Hardware Description Languages (HDLs) and their associated software tools are being used to successfully translate HDL source code into a form suitable for layout as large integrated circuits or for loading into a Field Programmable Gate Array (FPGA). Standard HDLs such as Verilog and VHDL are available, and newer HDLs such as SystemC, and SystemVerilog are becoming more popular for very complex newer designs.

A circuit is a system of interconnected components designed to perform an electrical function. Most circuits are comprised of active components that each perform a specific function when power is applied. The components send signals to each other via their interconnections. A signal is a controlled time-varying value sent from one point in a circuit to another.

Netlists are usually considered the lowest level form of unrouted circuit representation in a circuit design process. A netlist typically comprises a list of named component or gate instantiations that are connected by wires. The gates are typically basic building blocks that are made available in the technology selected to implement the circuit. Netlists are intended to have behavior equivalent to the functionality expressed in the original source code, although netlists represent real logic devices with inherent performance limitations. Netlists are usually concrete entities with no further abstractions to be resolved in their construction.

The objective of most HDLs is to express circuit functionality in a way that can be translated to a netlist.

All HDLs support the use of some type of high-level functional entity in source code that can be translated into a netlist using appropriate translation tools. Most translation tools can synthesize netlists based on the implied behavior described by these functions. Most HDLs also allow circuit structures to be defined directly.

Within translation tools, HDL source code is subject to tokenizing and parsing steps which create data structures called node trees. These node trees are much more amenable to subsequent processing than source code text. The techniques for writing tokenizers and parsers are well known in compiler art.

Some HDLs are intended for elaboration processing. This processing stage is implemented to work on node trees, and calculates various build parameters prior to starting subsequent processing such as synthesis or structural expansion to gates. Parameters include things like bus widths, or constants to be represented as fixed bus values. Elaboration can also be used to provide abstract control in building circuit structures.

Large circuit designs use function hierarchies to describe designs. A top level function is defined, which calls other functions, and so on down to lower levels, forming a function hierarchy.

At the lowest level in digital systems, only two logic values 0 and 1 are used to represent information at a particular time. Generally, digital logic associates these two logic values with two reliably discernible attributes of real systems in accordance with the laws of physics. In reality, the relation between the attributes and logic levels is purely a matter of definition for a particular technology. In most technologies, each wire is used to carry a small or large voltage to represent a logic 0 or a logic 1 value respectively.

The state of a circuit is defined by the logic levels stored in all its storage elements at a particular time. Storage elements can store logic values until specific types of circuit events direct them to store new values.

Synchronous circuit designs use a clock signal to define when state changes occur in storage devices within a circuit. The clock signal is usually sent from a circuit input to each storage device within the circuit. The idea is that on each active clock event, each storage device samples its inputs derived from state that was set on the previous active clock event. The most common storage devices are usually registers. In particular, a D-type register samples a logic level on its data input at a time defined by a specified active clock edge transition on its clock input. A very short time later, the sampled logic value appears on the register output.

In synchronous designs, the output from one register propagates through various combinational logic devices and back into the inputs of other registers. On each active clock edge, the present state of all the registers are presented as inputs to the combinational logic between them, and the combinational logic outputs determine the states of the registers on the following active clock edge.

Clock signals usually need to be distributed around an integrated circuit. If the relative clock signal delays between the clock input and each clocked device in the circuit are within a limit, then all state changes on that clock signal can be treated as simultaneous. If the skew between delays exceeds this limit, then the output of one clocked device could change quickly enough to be sampled by another clocked device on the same active input clock signal edge event, instead of a previous active event. This timing-sensitive behavior is termed a race condition, and is conventionally avoided by using tools to implement sophisticated clock signal distribution strategies, and by adding gates to delay certain signal paths where they are needed based on timing analysis. An upper skew limit is usually set as a design goal compromise between what is achievable for the selected technology, chosen layout tools, and circuit size.

Combinational logic, as its name suggests, maps each combination of input values to an intended output value. Combinational logic devices propagate input changes to their outputs, usually in a relatively short time period compared with the time interval between active clock edge events.

An advantage of the synchronous design methodology is that it simplifies the timing problems down to one issue: for all allowable register state changes, is the combinational logic between registers able to propagate new states arising from an active clock edge event fast enough to reach the inputs of receiving registers in time to be reliably sampled on the next active clock edge event? Static timing analysis tools are usually able to verify that this is the case, as long as they have accurate timing models for the registers and combinational logic used, and as long as they have accurate wire delay values obtained from layout.

Synchronous designs can form one or more pipelines, where data can be pumped through from register to register on each clock, allowing new data to enter the pipe, and processed data to leave the pipe on each clock. This allows pipelined designs to have a throughput that matches their clock speeds.

Synchronous designs can also form state machines, where the current state of one or more registers, via combinational logic, feed back into their own inputs. For example, counters that count to a new value on each clock are a specialized type of state machine that uses their previous count state to calculate their next count state.

A clock domain is a contiguous region of the circuit whose state changes all occur on the same clock edge event, and whose registers are connected via combinational logic. Some circuit designs use multiple clocks, and each clock can serve one or more clock domains. The relative timings between events in different clock domains are often unknown, and are usually assumed to have unrelated or asynchronous timing. Timing between any pair of registers in a clock domain is fully synchronous. Two or more clock domains on the same clock and the same active clock edge, if subsequently connected together via combinational logic, form one larger contiguous clock domain. Contiguous clock domains can also be formed across function call interfaces.

Clock contexts are statements that control one or more substatements. The clock context names a clock signal, and the active edge on that clock signal for all clocked state changes in the substatements, such as register assignments.

Clock contexts are a great convenience to a designer. Without them, a circuit designer would be forced to define the clock and clock edge on each clocked assignment. This would make source code much more verbose, and harder for the circuit designer to check for errors.

The benefits of clock contexts are that clocked storage components are automatically inferred whenever assignments to storage occur within the context. The inferred component's clock input is automatically connected to the clock signal associated with the clock context. Furthermore, the clocked components are selected by the translation tool so that they change their state when the specified clock edge event occurs. Components are selected by name in instantiations within an output netlist.

Conventional HDLs that allow clock contexts only allow them to be defined with associated absolute edges. This limitation reflects the range of active edges supported in the digital storage devices themselves. An absolute edge is usually only specifiable as one of the three useful types possible on a single clock signal: either a rising edge, or a falling edge, or both edges. A rising edge is conventionally defined as a change in a signal level from a logic 0 to 1, and a falling edge is a change from a logic 1 to 0. Henceforth, unless explicitly indicated otherwise, all specified clock edges are assumed to be active edges, as no state changes occur on other edges.

The problem with most HDLs is that they only allow the definition of fixed and absolute clock edges in clock contexts. This limitation reflects the range of active edges supported in the digital storage devices themselves. An absolute edge is usually only specifiable as one of the three useful combinations possible on a single clock signal: either a rising edge, or a falling edge, or both edges.

For example, the popular Verilog HDL allows a rising edge clock domain to be defined within a module entity, as in the following code fragment:

always @(posedge clk) // state changes occur on the rising edge of 'clk'
   begin // clock context start
   // all '<=' assignments to 'reg' types now infer rising-edge triggered
   // D-registers with their clock input connected to the 'clk' signal.
   my_reg1<=a; // '<=' assigns 'a' to 'my_reg1' on rising edge of 'clk'
   my_reg2<=my_reg1; // output of 'my_reg1' is input to 'my_reg2'
   end // clock context end Note that '//' and any following text on the same line are comments that are ignored in Verilog language processing. The reserved word "posedge" is a Verilog abbreviation for a "positive edge" or rising edge.

The "always" clock context in the above Verilog example is a single statement that controls the interpretation of other statements (separated by ';') within its controlled statement block. The statement block is delimited by the begin-end word pair. The clock context definition in the above example causes a translation software tool to connect both the registers "my_reg1" and "my_reg2" to the "clk" input. For simplicity, the declaration of these registers is not shown. The "posedge" reserved word causes registers to be instantiated by the "<=" assignments in both cases. The register clock inputs are connected to the "clk" signal, and the register types are chosen as rising-edge to comply with the rising edge specification.

One of the advantage of using an HDL that allows the use of clock contexts is that the designer doesn't have to specify a clock signal and clock edge sensitivity for each register assignment controlled by the context. This makes the HDL source code simpler and easier to understand, allowing the use of simple '<=' assignments to registers in the above example.

The equivalent of functions in Verilog are "module" entities. The above "always" statement is used within a module. In Verilog, modules call other modules by instantiating them.

Unfortunately, Verilog can only accept clock context edge specifications using absolute clock edge terms such as "posedge" or "negedge" (a "negative edge", or falling clock edge) reserved words.

If Verilog source code uses all "posedge" clock edges on a particular clock signal, then modifying the source code to use "negedge" (or vice versa) requires editing the edge type on every clock context in the design.

Clock contexts are very common in source code. If changing the active clock edge is performed manually, then there is no guarantee that the designer will remember to change all source code relating to edge specifications. Errors can lead to a circuit designer having to spend time fixing circuits with functional and timing problems.

While it may be possible to perform automatic text substitutions in source code in order to change one edge type to another, there are difficulties in performing this task externally to the translation tools. Major difficulties are:

(a) The same clock signal may be named differently across the functions or Verilog modules that form a hierarchy.

(b) Some designs use multiple clock signals that need to be considered separately.

(c) HDL source code preprocessing may complicate automatic discovery.

Therefore it may be difficult to identify the clock contexts with edges that need to be changed.

If designers use a mixture of rising or falling edge clock designs, and if they also need to have reusable libraries of commonly used Verilog modules, then they may have to have a rising and falling clock edge version of each clocked Verilog module type. If rising edge and falling edge versions of a Verilog module are both needed, then the versions must be named differently in source code. Both versions have the same input and output connections, so if a Verilog module with the wrong clock edge is instantiated by another Verilog module, everything may appear compatible, and it may even seem to simulate correctly. However, interface timing between the two modules can be badly effected at higher clock speeds.

An inverter gate can be used to invert a clock signal. It effectively swaps the edge timing behavior of rising and falling edge clock contexts. In principle, clock inverters can be inserted into a clock signal path to convert a rising edge Verilog module to a falling edge Verilog module, or vice versa. However, inverters in the clock signal path severely degrades the effectiveness of clock signal distribution in high performance circuit designs.

Other well known HDLs such as VHDL, SystemC, and SystemVerilog have the same problems as Verilog in regard to limitations associated with absolute clock edges.

Accordingly, a method is needed to allow a function to be used as part of a function hierarchy, no matter what active clock edge is used in the hierarchy. The method should allow a translation tool to implement the design by selecting register devices with the correct edge sensitivities for each distributed clock signal.

OBJECTS AND ADVANTAGES

The objects and advantages of the present invention are:

(a) to provide a means whereby clock contexts with inherited edges can be used in source code written in a Hardware Description Language. Inherited edges allow the same function to extend a synchronous clock domain used in its caller within a function hierarchy. This extension applies whether that clock domain uses a rising edge, falling edge, or both edge clock signal. In contrast, conventional absolute active edges provide no adaptability across function interfaces, so they can only extend a synchronous domain that uses the same absolute edge type.

(b) to provide support for oppositely inherited active clock edges, which are used to help alleviate some types of timing problems in synchronous designs.

(c) to provide independent inheritance for each separate clock signal, and thereby provide for inheritance in multi-clock circuits.

(d) to improve source code reusability. If only inherited (no absolute) clock contexts are used within a function hierarchy, then the active clock edge associated with a clock signal can be specified in just one place in a function above the top level of the hierarchy. In this case, the function hierarchy may be used in a circuit that uses any absolute edge type. Higher level functions can be built on top of the reusable foundations of lower level function hierarchies. The invention therefore allows the design of reusable function hierarchies at any realizable level of complexity.

The grammar of existing translation tools may need to be extended to support inherited clock contexts. The inherited edge types are in addition to the conventional absolute edge types, so they need not cause any incompatibilities between legacy source code and translation tools that use the invention.

Further objects and advantages of my invention will become apparent from a consideration of the drawings and ensuing description.

BRIEF SUMMARY OF THE INVENTION

The invention allows clock contexts in Hardware Design Languages (HDLs) to inherit their active clock edge from clock contexts higher up in a function call hierarchy. Software tools for translation or synthesis to netlists can be modified to search for appropriate controlling clock contexts that can provide an inheritable active clock edge during design elaboration.

BRIEF DESCRIPTION OF THE DRAWINGS

FIG. 4a shows an example of source code in an exemplary HDL intended to illustrate the invention, and that uses both absolute and inherited clock contexts.

FIG. 4f shows an equivalent circuit to the function hierarchy starting at "top_entity" in FIG. 4a.

DETAILED DESCRIPTION

Figure 1:
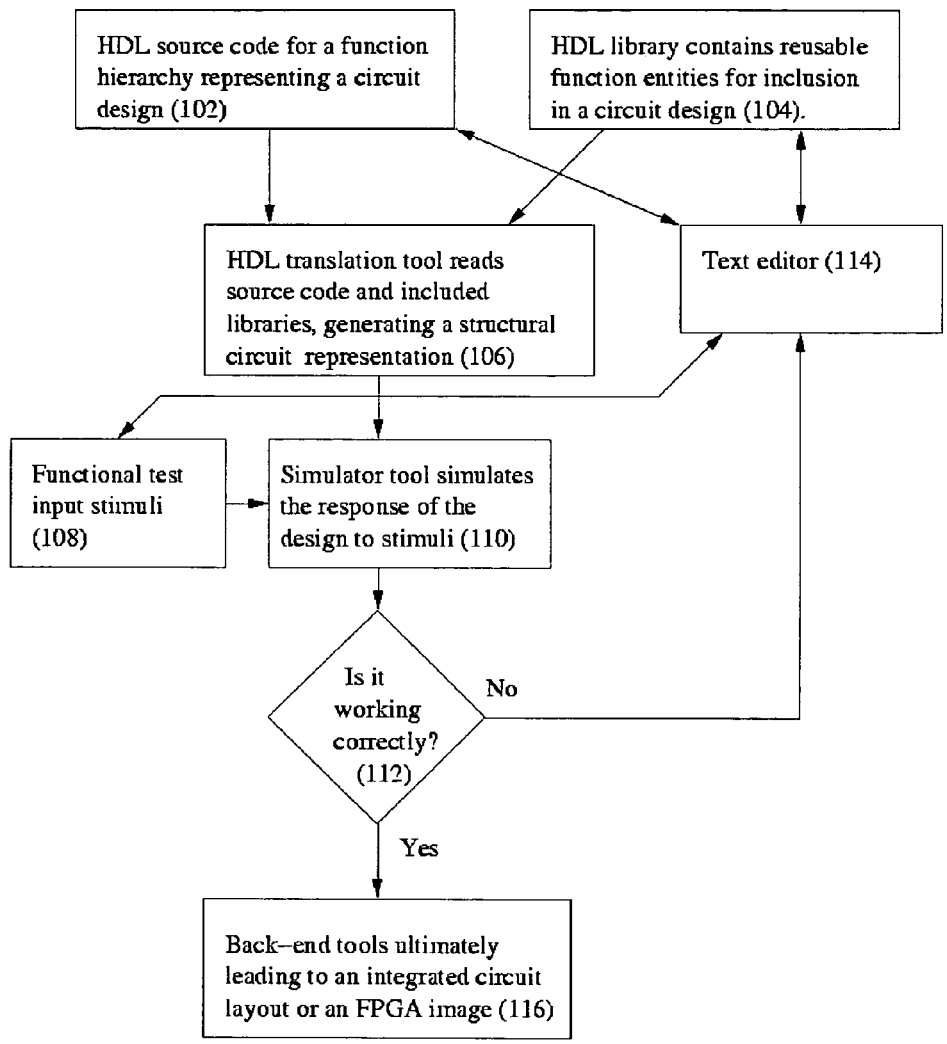
FIG. 1 is a block diagram showing a front-end tool flow from source code to a netlist.

In the following description, a preferred embodiment of the search algorithm of the present invention is often described with regard to preferred process steps, data structures, and related techniques. However, those skilled in the computer arts would recognize, after obtaining an understanding of the algorithm, that its embodiment is most easily and ideally implemented using a general purpose computer operating under program control. Modification of the computer to implement the process steps and data structures described herein would not require either additional invention or undue experimentation.

The search algorithm has been implemented as software to run on a hardware computing platform. The search algorithm has facilitated the design of more flexible and reusable software library components for use in digital circuit designs.

The objects, advantages and other novel features are apparent from the following detailed description when read in conjunction with the appended claims, and attached drawing figures.

Source Code and Translation

Source code is commonly expressed in a higher level abstract form using a Hardware Description language (HDL). Typically, source code is written by a human, although in principle, that same source code may be able to be machine generated by additional translation steps. However, any such additional steps are outside of the scope of this invention, unless they themselves incorporate or use the search algorithm.

An HDL translation tool translates from a more abstract circuit design representation to a more concrete low-level representation such as a netlist. The search algorithm can be used as part of the translation process, and can therefore be incorporated into the translation tool. The invention can help circuit designers design digital circuits more easily by allowing them to write source code that is more reusable.

Back-End Processing

After translation, the resulting netlist can then be passed on to back-end processing for:

(1) layout and fabrication as an integrated circuit, or
(2) creating a data pattern for loading into a Field Programmable Gate Array (FPGA) or some other programmable device that can implement the function expressed in the digital circuit design.

Clock Contexts

A statement is a computer science term for a self-contained language construct. An HDL grammar can be designed to allow many types of statements in source code syntax. In most HDLs, lists of statements can be grouped together under the control of a clock context, which itself is usually a statement.

A clock context comprises:

(1) an associated named clock signal and
(2) an associated clock edge type that applies to the clock signal, and
(3) one or more statements under its timing control.

All assignments to storage types within (3) above result in the instantiation of storage devices with clock inputs connected to the clock signal (1) above. The storage devices are chosen such that they can only change their stored value according to the edge specified by the clock context in (2) above.

In particular, D-type registers sample a logic level on an input at a time defined by a specified clock edge transition type on a dedicated clock input. A very short time later, the sampled logic value appears on the register output. For a particular implementation, registers with rising or falling active edge responses are usually available amongst other logic devices in a library.

Whenever an active clock edge event occurs on the clock signal, then any clocked storage arising from the statements in (3) above will transition simultaneously from their existing state to their next state. The next state is determined by previous state or external inputs, and by any combinational logic in the paths to the storage sampling input. Combinational logic components comprise basic logic gates such as "and", "or", "nand", and "nor" gates, and other basic logic functions as is well known in the digital circuit design art.

In the invention, if HDL source code uses syntax to specify a clock context with an associated clock signal and directly inherited clock edge, then the search algorithm starts a search from this context. The search attempts to find the nearest controlling clock context associated with the same clock signal, if such a context exists. The clock edge associated with the controlling clock context then replaces the directly inherited clock edge. The search algorithm allows the same HDL source code to be effectively reused in circuit designs based on any type of absolute edge.

Source Code Processing

In a sequence of processing steps well understood in the compiler art, source code can be partitioned into a sequence of tokens using a software program called a lexer or tokenizer. Tokens correspond to recognized groups of adjacent characters in source code, such as single or multi-digit numbers, names, or special characters such as the characters: ( ) [ ]+ − * / =, etc. The tokenizer output is a sequence of token types and associated token values. For example, a token can have an integer type with a value of 27, or a token can have an identifier type with an associated character string name such as "two_clock", or a token can be a special character type such as "+", with no associated value.

Tokens can also be reserved words, which are usually sequence of adjacent alphabetic text characters that are recognized as having a special meaning in a chosen language. Reserved words are not normally allowed to be used as names of things, such as variables or functions.

In computer science, a grammar is a set of language constructs that define a language. In a formal HDL description, each language construct is itself defined as one or more input-matching alternatives. Each alternative is defined as a specific combination of other language constructs, or of token types. The way in which grammars are defined is well known in the compiler art. Variations on Backus Naur Form (BNF) are typically used to describe grammars. Software tools such as GNU bison are available to software tool developers for reading a BNF-like grammar description and generating software code called a parser. Parsers interpret input token sequences and any associated values according to the rules expressed in the grammar definition.

Syntax is a computer science term for the particular way in which language tokens are put together in order to produce a desired effect. Source code is supposed to have syntax that obeys the grammar of a chosen HDL. If the syntax is wrong for the grammar, then tools that read the source files should generate a syntax error.

Parsers are usually designed to construct one or more trees of nodes that represent the syntax of source code input. A node tree is a computer science term for a tree-like structure made from nodes. It is possible for two different tokenizer/parser designs to generate two different node trees from the same input. Nevertheless, the nodes trees should be structurally equivalent, even if they differ in some details. Any exemplary node tree should be suitable for processing by the search algorithm. As node trees are conventionally represented as branching out down from the top node, they actually appear to be more like a branched plant root system than a tree. Nevertheless, a node tree is the conventional name.

A node is a computer science term for a structured data item that is usually allocated storage in computer memory while running a computer program. A node comprises storage for a type attribute, and storage for references to other nodes. The node references are used to form node relationships that define the structure of the node tree. Relationships comprise parent, child, or sibling types. Each node can only have one parent, or it can have no parents if it is at the top of a node tree.

A reference is a computer science term for a container of information that refers to data elsewhere in computer memory, as opposed to containing the data itself.

It is possible to create a node tree using an array of nodes, with array indexing to form node relationships instead of references. However, arrays are not able to efficiently expand to fit an unknown problem size, so this approach, although implementable, is not ideal.

The invention does not advocate any particular grammar or syntax for defining a clock context with an inherited clock edge, as long as it can be represented within a node tree.

Function Hierarchies

A circuit design is usually expressed as a hierarchy of HDL functions, with a single function at the top.

Each HDL function can call other HDL functions, allowing the designer to break down problem complexity into simpler and simpler sub-problems. A circuit design with naturally expressible subsystems is therefore usually expressed as a hierarchy of HDL functions, with a single function at the top. Each HDL function is usually contained within a file.

To be useful, an HDL function is ultimately translated into a structural form using the translation tools. The function should therefore use syntax that obeys the grammar of the chosen HDL. Depending upon the HDL, functions are identified with specific reserved word tokens, such as "module", "circuit", "entity", etc. The term "function" is used here as a generic term. Some HDLs supports more than one type of function, with different semantics in each case. In some HDLs, a call is also equivalent to a parameterizable instantiation.

A function call is usually in the form of a statement, or it occurs within a statement.

FIG. 1—A Typical Circuit Design Flow

FIG. 1 is a flowchart that describes a part of a design flow for creating a digital circuit design. This design flow and many variants are well known in the circuit design art. This flowchart is only intended to show a design flow or development environment that can use the invention. It is not intended to limit the scope of the invention.

The digital circuit designer usually runs the stages of the design flow of FIG. 1 as one or more programs on a computer. The computer has file storage, and the ability to run one or more programs as tools that can each process files as input and create files as output. Files can also act as intermediaries between programs.

A particular instance of a digital circuit design is described by its source files, written in the chosen HDL. In principle, a design flow can be applied to many different circuit designs, and a circuit design may be translatable to netlist form using more than one type of design flow and its tools. Therefore a design is not characterized by the design flow. Each design instance is usually represented by its own directory in computer storage. Any directory can also contain other directories under it, allowing the creation of a directory hierarchy.

Any directory can also contain files. The source files for a project are placed in specific directories, according to conventions for the chosen circuit development environment. These conventions allow the tools to know where to find the files they need in order to implement the design flow. The circuit development environment and its conventions are usually chosen by designers. The directory structure is not usually mandated by the tools themselves, nor by the design flow. Therefore, a particular directory hierarchy that supports the design flow is not shown.

The design flow of FIG. 1 shows source code (102) that is specific to each circuit design. This design code represents the designer's input as one or more source files. Each source file contains text, written by a circuit designer. This text has syntax that complies with the grammar rules of the chosen HDL.

A function in design code (102) can call functions contained in one or more HDL libraries (104). HDL Libraries, as their name suggests, are also written in the chosen HDL. In practice, the decision as to whether a function is placed in design code or in an HDL library is a judgment call made by designers based on the perceived reusability of the function. If a function is not put into a library, it can be modified freely, but then it doesn't help reduce the tendency to "reinvent the wheel". If a function is very specific to a design, it may not be reusable in practice.

Library functions that are widely available are usually well tested over time, so a designer can use them with confidence.

Source code is usually kept in one or more files. In the design flow of FIG. 1, arrows are used to denote the direction of data flow. Double-ended arrows denote a bidirectional data flow. The double-ended arrows shown into (102), (104), and (108) indicates that the files represented by each box are readable and writable by the text editor (114).

Design code (102) and library code (104) files are also readable by the translation tool (106). This read-only data flow relationship is shown by the single-ended arrows. The designer usually indicates to the translation tool the name of the top level function of the function hierarchy within (102). When the translation tool is run, it first reads in one or more design files (102) that constitute the circuit design. The design files can name any library files (104) to also be included as input to the translation tool. The tool then performs various other processing steps (see FIG. 2, described later), and finally generates a structural circuit representation of the design as its output. The output should have the same functionality as described by the semantics of its input source code.

The designer can optionally verify the design behavior using a simulator tool (110) in FIG. 1. This tool takes as input:

(1) a design represented at some level of abstraction, and
(2) input stimuli for the design.

The simulator tool takes the design files as input, and simulates the behavior of the design. The simulator uses the input stimuli to generate a response from the design as simulation output. The output signals from simulation can then be verified, either automatically against a formal behavior description, or against a golden standard, or manually by the designer. If the design is tested as incorrect (112), then the designer needs to examine the test response and figure out what is wrong. The designer can then:

(i) edit the appropriate input file in (102,104,108), and then
(ii) retranslate using (106), and then
(iii) resimulate using (110).

This cycle of edit, translate, and resimulate constitutes a development loop in the designer's work flow. Looping continues until the design behaves as required.

Once a correct design is obtained, then the results are passed on to back-end processing (116). Back-end processing is outside the scope needed for understanding this invention.

Variants on this basic development cycle are commonly used, including simulating directly from source code (102, 104), instead of using the output of the translation tool (106). In this case, the simulator tool can also incorporate the search algorithm. The algorithm allows the simulator tool to be used with clock contexts having inherited edges in order to infer correct state change behavior during simulation.

Figure 2:
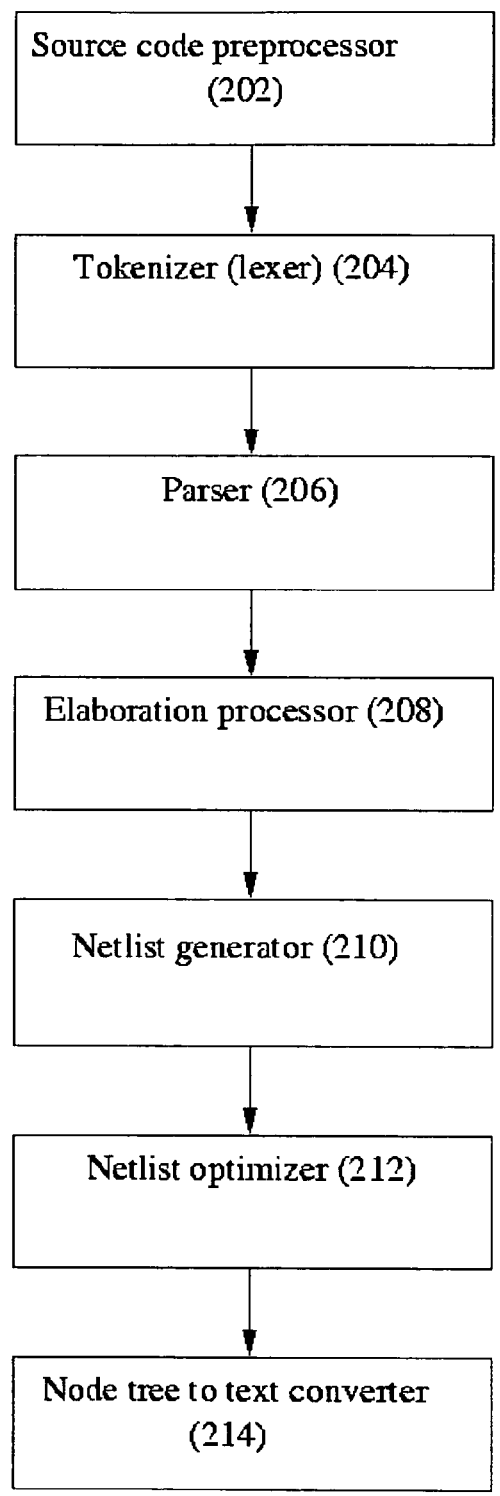
FIG. 2 is a block diagram showing the processing steps typically used to obtain a netlist from source code. The search algorithm of the invention is usually incorporated into the elaboration processing stage.

FIG. 2—Translation Tool Processing

FIG. 2 is a flowchart showing the basic stages of processing within a typical translation tool (106) in the design flow of FIG. 1. The processing flow of FIG. 2 shows the steps that are conventionally used in the construction and processing of node trees. The invention extends the capabilities of the Elaboration processor (208).

The process of translation can be implemented as a single software tool. Translation can also be implemented piecemeal using a multiplicity of separate tools, with each tool handling one or more of the stages shown in FIG. 2. In this case, the output of each tool is used as input to the next tool. On a computer, tools can communicate directly using pipe mechanisms provided by the computer's operating system. Tools can also communicate via intermediate files.

FIG. 2—The Preprocessor (202)

The first processing stage in the processing flow of FIG. 2 is the source code preprocessor (202). Source code preprocessing conventionally performs several important functions. In particular, preprocessing allows one file to include another by name. For example, the design code (102) represented in FIG. 1 can include one or more library files (104). The included library source code is then imported by the preprocessor, and this library code is thereby added to the design code at the output of (202).

FIG. 2—Tokenizer (204)

Preprocessor output is then processed by a tokenizer (204), whose function was described earlier. The tokenizer splits up the HDL input text into tokens to send to parser (206).

FIG. 2—Parser (206)

The output of the tokenizer (204) goes into a parser (206) whose behavior is defined by the grammar of the HDL. The parser's job is to create a node tree structure from the token sequence it obtains from the lexer. Implementing parsers to create node trees is well understood in the compiler art.

The parser returns references to the top of each node tree that corresponds to each input function in source code. These top references are each used as starting points for subsequent processing of functions by the elaboration processor (208).

Each node comprises storage for:
(1) a node type, and
(2) references to other nodes.

The node type is used to identify the type of node according to how it relates to the syntax of source code. For example, a statement can be represented by a node. As different statement types are usually allowed in a language, the node that represents a statement has its node type value set in order to identify the statement type it represents.

The node references are used to form node relationships, such as parent, child, or sibling. Each node can only have one parent, or it can have no parents if it is at the top of a node tree.

Node references are used by the parser to construct the node tree to represent the syntax of the source code, as interpreted according to the grammar rules for the HDL. An exemplary node tree represents source code syntax as a node tree that is suitable for the elaboration processing stage (208), and also for each subsequent processing stage. Node tree processing traverses the node tree and executes various tasks based on the data stored at each node. Node tree processing may modify the node tree such that the output node tree is a modified version of the input node tree.

A function acts as a container for encapsulating a body of source code within it. Within the body, nodes can be classified into one of two major types:

(1) An expression node is used to represent an expression in source code. An expression node evaluates to something during node tree processing. An expression node may be a literal value such as a number, or it may be an operator such as add, subtract or multiply. If it represents an operator, then its child nodes represent any subexpressions that are inputs to the operator.

For example, (3+4)*11 is a numeric expression that evaluates to 77 according to conventional mathematical grammar rules. As is well known in compiler art, this expression can be represented using a node structure like:

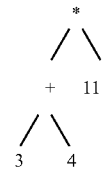

(2) A statement node is used to represent statements in source code. A statement node groups its child nodes together, thereby forming an association between its child nodes. A statement does not evaluate to something, but as its name suggests, is a self contained directive. Assignments and clock contexts are usually statements.

Statements can be devised to form associations between things. For example, the following English Language statement:

"On a rising edge of the signal xclk, change any state associated with the following statement: 'a' becomes 'b'."

associates "xclk" and "rising" to give a particular meaning to when the value of 'b' is assigned to 'a'. Expressions are intended to reduce down to a single result, so they cannot describe an association between any subexpressions. In implementation, data items in a statement can be associated by being stored together in the same node or data structure that represents that statement within a node tree. They can also be associated if they are stored in separate nodes that are connected using fixed, predetermined node relationships. In either case, a search is not needed in order to establish the association.

A clock context in source code defines the interpretation of language constructs under its control. In a node tree this control is represented by a clock context node. The language constructs under its control are represented by its child nodes. The controlled language constructs are usually a grouped list of one or more adjacent HDL statements represented as sibling nodes.

FIG. 2 Elaboration Processor (208)

Elaboration processor (208) evaluates the source code in its corresponding node tree form as obtained from the parser. Elaboration is primarily used to convert language abstractions into more concrete descriptions.

For example, the output node tree from elaboration processing usually defines specific bus widths. Based on bus widths and other parameters defined in source code, elaboration may also select a specific method of implementing a logic function when given alternatives. These features can be used to automatically adapt the logic function to correctly handle its inputs and outputs.

In digital circuit designs, a bus is defined as an array of connections. A bus is typically used to represent a value in binary form within a known period of time relative to the active clock edge.

Elaboration processing usually starts at the top of the node tree that represents the highest level function in the function hierarchy. The highest level function is usually explicitly named by the circuit designer. Elaboration processing then starts by traversing that node tree structure, interpreting nodes with elaboration semantics as instructions to perform certain tasks. These tasks implement their actions by modifying data stored at nodes, and by modifying the tree structure itself. When a function calls another function, the other function is then elaborated to completion before returning back to the caller. The other function may use parameter values passed in from the caller. The caller should therefore calculate these values before they are passed in.

A function may be called from more than one other function, and with different input parameters on each call. This implies that different output can be produced from the same function each time the function is called. To support such a dynamic view of functions, the node tree representing the called function is cloned, forming another node tree with the same structure. The clone is identical in form to the original tree, but is a separate (orphaned) node tree with its own top reference. The clone can then be modified during elaboration and other processing, without changing the original tree. The original tree therefore acts as a template that remains available to be cloned again for any subsequent calls to that function.

Methods of node tree cloning are well understood by those skilled in the compiler arts.

During elaboration, if a function call is performed, then elaboration enters into the called function. The calling function contains a node that corresponds to the calling expression in source code. The called function is usually represented by the node at the top of its node tree. When the function call is elaborated, the search algorithm requires that a backtrace reference from the called top node to the calling node is also formed. This reference allows the search algorithm to trace from the called function back up into the caller. If each call to a function is actually a clone of the function node tree, then its backtrace reference will never be overwritten by other calls to the same function.

Some well known logic construction problems, such as priority encoders or carry-select adders, are much easier to design if function recursion is used. A recursive function is usually designed to partition large-parameter problems into two or more small-parameter subproblems of the same type, and then call itself to evaluate each subproblem. This self-calling continues down, forming a function hierarchy, until the problem parameters are small enough that other direct solutions can be used instead of recursion. In the function hierarchy, cloning from a node tree template allows every function call to be independently evaluated with differing parameters. As each function call at the bottom of the function hierarchy completes, it returns up to its parent in the hierarchy. This process continues to complete the traversal of a function hierarchy with recursion, just as it would without recursion.

According to the invention, elaboration processing (208) can be modified and extended to implement clock context inheritance using the search algorithm. Node tree inputs are modified by the search algorithm such that each inherited clock edge is converted to an absolute clock edge. Therefore later processing from (210) onwards does not need to change its behavior according to the invention, as it is not effected by the presence of nodes representing clock contexts with inherited edges in its input node tree.

FIG. 2—Netlist Generator (210)

Netlist generator (210) describes the next processing stage, which is also language dependent. This processing stage takes in the node tree from the elaboration processor (208) and creates a modified node tree as its output into (212).

The netlist generator represents those parts of the HDL language that are not handled by preprocessing or elaboration. Most HDLs can describe circuit structures directly, in which case the netlist generator is used to reduce higher level abstract structural descriptions down to a netlist. Some HDLs support the description of the behavior of circuits, and source code in these languages can be directly simulated. In behavioral descriptions, hardware resources are not directly declared, but are instead inferred from the behavior description. This process of inference and the creation of a structural description from a behavioral one is called synthesis. HDLs can use elaboration semantics in addition to structural or behavioral descriptions, and the most common HDLs have support for all three.

FIG. 2—Netlist Optimizer (212)

Netlist Optimizer (212) represents a final optimization stage, which performs various transformations to simplify logic represented in a netlist form. This processing stage takes in the node tree from (210), and creates a modified node tree as its output. This final node tree is usually converted back to a text representation of the netlist at the output (214).

Multi-Tool Processing

The steps of tokenizer (204) and parser (206) together form a source code text to node tree converter. Then all node tree processing can occur. The inverse of this conversion is performed by the much simpler node tree to sequential text converter (214). In actual implementation, it may be desirable to break up the node tree processing into smaller tasks. In this case, conversion to a node tree is followed by some node tree processing and then conversion back to an intermediate sequential text form. Then this intermediate form is then reconverted back to a node tree, and some more node tree processing occurs, which is again converted back to intermediate text, and so on. For example, the three tasks represented by the elaboration processor (208), netlist generator (210) and netlist optimizer (212) provide a natural boundary for three separate tools enumerated as follows:

1) source code→node tree→elaboration processing→intermediate A 2) intermediate A→node tree→netlist generator→intermediate B 3) intermediate B→node tree→netlist optimizer→netlist result C where each step communicates via an intermediate sequential form such as a text file. No matter how node tree processing is partitioned, the results are equivalent. The invention describes the search algorithm as part of elaboration. In a minimal elaboration case, node tree traversal may be solely for the purpose of using the search algorithm.

Multi-tool processing allows designers to see what the various processing stages actually do to their source code, which may allow them to find errors in their source code Inherited Clock Contexts A clock context can conventionally specify an associated absolute clock edge, in which case the search algorithm is not used. An absolute clock edge is ultimately needed for subsequent device selection.

The search algorithm goes beyond the conventional art by supporting the use of clock contexts with inherited edges, or inherited clock contexts. Inherited clock contexts are clock contexts that have an associated inherited clock edge. The directly inherited clock edge has already been briefly discussed. Ultimately the goal is to use the search algorithm of the invention to replace each inherited edge in the node tree by an absolute edge that is inherited from a controlling clock context node that is higher up in the node tree or higher up in the function hierarchy. Absolute edges are needed later on in order to make correct device selection in output netlists.

During elaboration, if a clock context node with an associated inherited clock edge is encountered, then the node becomes a start node for the search algorithm. The search attempts to find a controlling node at a higher level in the node tree from which to inherit an absolute edge.

The search algorithm supports the use of two inherited edge types in addition to the absolute edge types:

(1) If the start context specifies a directly inherited clock edge, then the found edge is also used as the absolute edge within the start context.

(2) If the start context specifies an oppositely inherited clock edge, then the opposite edge of the found clock edge is used as the absolute edge within the start context.

After a complete traversal of a node tree using elaboration processing that incorporates the search algorithm, an absolute edge is obtained for all clock contexts in the resulting output node tree. The only exception to this is if an error occurs. Note that not all clock contexts may appear on the output node tree if other elaboration processing prunes the input node tree.

If the netlist generator (210) encounters a node that represents a statement controlled by a clock context, and if that statement results in the instantiation of one or more clocked storage devices, then:

(a) The type of the storage devices is determined by the absolute clock edge that is finally determined for the enclosing clock context. The enclosing clock context is defined as the first ascendant clock context node that is above the controlled statement node. In addition, the ascendant node must be within the same function that contains the controlled statement node.

(b) The storage device's write clock input is tied to the named clock signal associated with its controlling context.

An opposite edge results in a rising edge if a falling edge is found by the search algorithm, or a falling edge if a rising edge is found. Opposite edges are usually only used to improve circuit interface timing margins. However, if a both edge clock context is found, then an attempt to find its opposite is ideally interpreted as an error. This is because, considering all possibilities:

(1) If the opposite is also interpreted as both edges, then the "opposite" context actually changes nothing, and therefore edge timing does not change. As opposite edge contexts are usually intended to help with circuit timing problems, then this interpretation is not useful, and can even be misleading.

(2) Interpretation of the "opposite" as either a rising edge or falling edge is unintuitive and misleadingly biased.

(3) An interpretation as a "no edge" clock context isn't biased, but it is also useless, as no clocked state changes can occur under its control.

If a controlled statement does not participate in the creation of storage devices, then ideally the controlling clock context should have no effect on any logic that is generated from the controlled statement.

The main advantage of inherited clock contexts is that the same HDL source code can express functions for use with rising edge, falling edge, or both edge circuit designs.

Inherited clock contexts have two areas of impact in their implementation within translation tools:

(a) The grammar of the chosen HDL has to accommodate the reserved words that define inherited edge types. For example, reserved words such as "inherit" for a directly inherited edge, or "inherit opposite" for the opposite of the inherited edge can be used. This accommodation may also requires modifications to the tokenizer and parser processing in the tools.

(b) The elaboration processor is modified according to the invention in order to implement the search algorithm as part of elaboration.

Figure 3:
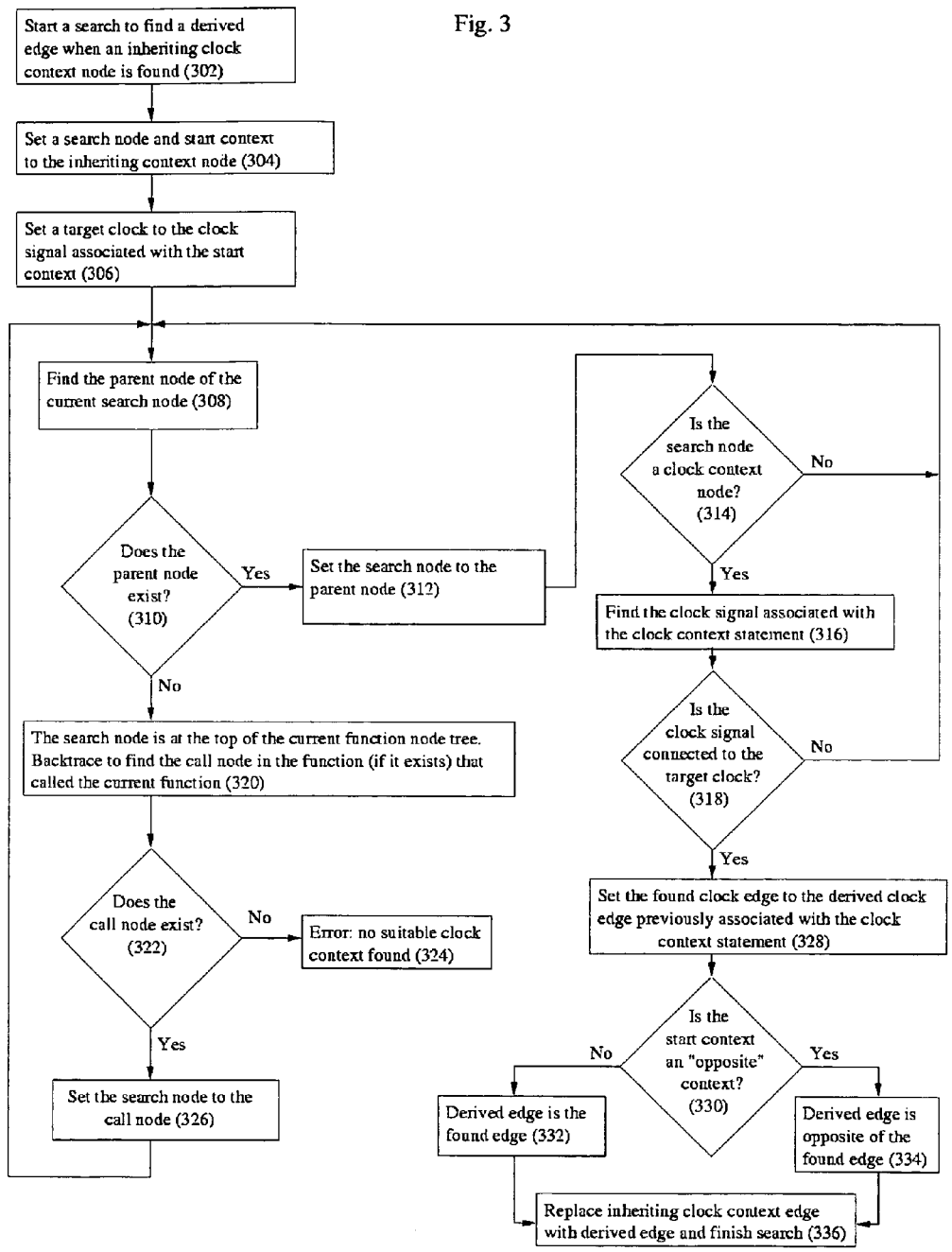
FIG. 3 is a flowchart showing the search algorithm of the invention.

When a node corresponding to an inherited clock context type is found in the node tree during elaboration processing, the clock context search algorithm as described in the flowchart of FIG. 3 is used.

Binding

Binding is a computer science term that refers to the act of creating a reference from each instance of the variable name to a data structure in computer memory that is associated with that name. Subsequently, the reference is used to access the data structure instead of the name. Binding is commonly performed as the earliest stage of elaboration processing because named objects such as busses or functions are already represented as nodes in the node tree output from the parser. These nodes have character strings containing their names. Binding resolves each node with the same variable name to actually reference the single data structure that represents the named object.

Binding is commonly used in node tree processing to implement the behavior that allows an assigned value to a variable to then be read from a separate instance of that variable name in a subsequent expression. For example, in a hypothetical computer language evaluating the pair of statements:

a=3;

b=4+a;

the storage referenced by "a" is assigned the value 3 in the first statement. With binding, the same storage is again referenced by the same name "a" in the second statement. The second "a" is therefore read as the same value 3, giving variable "b" the value 7. Without binding, each "a" is independent, so the value of the first "a" is not be readable in the second "a", or accessible for any subsequent use of "a" for that matter.

FIG. 3—Search Algorithm Flowchart

FIG. 3 is a flowchart describing the search algorithm as it is applied to a node tree. The search algorithm is part of the elaboration stage (208) in the processing flow of FIG. 2, which is in turn part of the translation tool (106) in the design flow of FIG. 1.

The flowchart starts at (302) when a clock context node with an inherited clock edge is encountered by elaboration processing. Step (304) sets the search node and start context variables to the clock context node. Then step (306) sets a target clock reference value to reference the clock signal associated with the start context.

The main loop then starts at the input to (308), which finds the parent node of the search node. If the parent node does not exist (310), then the search is at the top of the current data tree, and a backtrace reference is used (320) to find the calling function. If the calling node does not exist, then the search has reached the top of the function hierarchy, and no controlling node has been found. Ideally the tool then exits with an appropriate error message. If the calling node exists, then the search node is set to reference the calling node (326). The algorithms then goes back to the start of the main loop into (308) to continue the search.

If the parent node of a search node is found (310), then the search node is set to the parent node reference at (312). The node type is then extracted as a value associated with the node. If the node type does not correspond to a clock context statement as tested in (314), then continue the search into (308). If the search node is a clock context node, then a reference to its associated clock signal is readily obtained at (316).

Binding allows a simple comparison check (318) to see if the found clock signal reference is the same as the target clock signal reference found at (306) prior to the main search loop. However, when a function calls another function, the caller can pass wires or busses into the called function, thereby forming connectivity between them. Within each function, a wire or bus can be given any name. Therefore the same clock signal may have different names as it is connected between functions. The binding mechanism must therefore be extended to dynamically bind wires to reference the same signal if the wires are connected by a function call. Dynamic binding usually changes the signal name references in the called function to the reference values used in its caller. Note that dynamic binding is applied to cloned function node trees, so binding references can be modified without effecting subsequent calls to the same function.

If the found clock signal reference is not equal to the target clock reference at (318), then continue the search at the input of (308). If the found signal does match, then a found clock edge variable is set to the active clock edge value associated with the search node.

At (330), if the start context is an opposite edge type, then the opposite of the found edge is obtained as the derived edge (334). Otherwise, the found edge becomes the derived clock edge (332). In either case, the derived edge is also an absolute edge, and it replaces the inherited edge associated with the start context.

Replacement of inherited clock contexts is possible without effecting subsequent function calls because, as explained earlier, the algorithm operates on a cloned node tree. Replacement of an inherited edge with an absolute edge is desirable because subsequent processing of the clock context's controlled statements allows an absolute edge to be found. An absolute edge is needed to make concrete device selection later on.

FIG. 4a—Example of Source Code Using Clock Contexts

FIG. 4a shows a source code example of a function hierarchy consisting of three functions, "top_entity" (4002), "f1" (4004), and "two_clock" (4006). The source code is written in a hypothetical HDL that exemplifies the features of clock context inheritance.

The source code of FIG. 4a is tokenized using (204) and parsed using (206). The design decisions on how to tokenize and parse language to produce a node tree that represents the input syntax are well known to those skilled in the compiler art. For each of the three functions in FIG. 4a, drawing figures for corresponding exemplary node trees are given in the following table:

| function name | FIG. |
|---|---|
| top_entity | 4b |
| f1 | 4c |
| two_clock | 4d |

Comparing the source code and node trees gives the reader an intuitive idea of what an exemplary tokenizer and parser does, without having to understand their operation in detail.

The HDL source code of FIG. 4a is designed to show two important additional features in the invention:

(1) Nested clock contexts applied to two different clock signals, as in function "top_entity" (4002). Multiple nested clock contexts allow clock inheritance for functions that use multiple clock signals.

(2) The intermediate function "f1" (4004) passes its inputs straight to function "two_clock" (4006). Function "f1" also passes on the returned outputs from function "two_clock" back to its caller, "top_entity". The function "f1" does not use clock contexts, and yet the search algorithm can search through it if necessary. Functions can call other functions that use clocks, and pass clock signals into them. However, a function does not need to use clock contexts if it doesn't actually infer clocked storage devices. Thus clock inheritance can increase the flexibility of HDL source code, without increasing its complexity.

During elaboration, function "top_entity" in FIG. 4a calls function "f1". "f1" is an intermediate function that does little in this contrived example except call function "two_clock" as an expression. The call also passes on the inputs to "f1" into function "two_clock". The return value from function "two_clock" is an output signal. Function "f1" then returns this signal back to function "top_entity", where it is then assigned and thereby connected to the "top_entity" output "y".

Function "two_clock" (4006) declares two single-bit D-registers, "q1", and "q2", and then three statements.

The first statement within function "two_clock" is a clock context that uses a directly inherited edge on clock signal "clk1". This context controls the clocked assignment "←" of the input "in" to the input of register "q1" on a directly inherited clock event on the signal "clk1".

The second statement within function "two_clock" is a clock context that uses an oppositely inherited edge on clock signal "clk2". This context controls the clocked assignment of the output of register "q1" to the input of register "q2" on an oppositely inherited clock event on "clk2".

The third statement within function "two_clock" is a "return" type, where the signal from the register "q2" output is returned back to the calling function "f1", as the result of the caller's calling expression.

In this exemplary HDL, as one function calls another, its wire parameters are passed into its caller in the same order as they are declared. For example, in the following single-line excerpt from the function "top_entity" (4002) in FIG. 4a:

$$y=f1(clkA,clkB,x);$$

the signal parameters "clkA", "clkB", and "x" are connected to the input signals "clk1", "clk2" and "in" respectively of function "f1", as in the following single-line excerpt from function "f1" (4004) in FIG. 4a: function f1(input clk1, input clk2, input in)

After elaboration is completed, the D-register "q1" in function "two_clock" (4006) ends up being a rising edge triggered register type. This is because:

(1) register "q1" is assigned to as on the following-single-line excerpt from the function "two_clock" in FIG. 4a:

q1←in;

under the control of a clock context using a direct inherited edge for the clock signal "clk1", as in the following single-line excerpt from the function "two_clock" in FIG. 4a:
clock inherit clk1

(2) Within the search algorithm, binding and dynamic binding allow a simple reference test to establish that the clock signal "clk1" is also connected via function call parameters to signal "clkA" in the function "top_entity". The following is a single-line excerpt from within the function "top_entity" in FIG. 4a:
clock rising clkA From this fragment, and considering the clock connectivity, it can be seen that the found clock edge on signal "clkA" is a rising edge.

The rising edge of 2) above is therefore directly inherited by 1) above to produce a rising edge controlling context for the assignment to register "q1". Therefore a rising edge register is inferred after elaboration.

The D-register "q2" in function "two_clock" (4006) also evaluates to a rising edge triggered register type. This is because:

(3) register "q2" is assigned to as on the following single-line excerpt from the function "two_clock" in FIG. 4a:

q2←q1;

under the control of a clock context using an oppositely inherited edge for the clock signal "clk2", as in the following single-line excerpt from the function "two_clock" in FIG. 4a:
clock inherit opposite clk2

(4) Within the search algorithm, binding and dynamic binding allow a simple reference test to establish that the clock signal "clk2" is also connected via function call parameters to signal "clkB" in the function "top_entity". The following is a single-line excerpt from within the function "top_entity" in FIG. 4a:
clock falling clkB From this fragment, and considering the clock connectivity, it can be seen that the found clock edge on signal "clkB" is a falling edge.

The opposite edge of the falling edge of 4) above is therefore inherited by 3) above, producing a rising edge controlling context for the assignment to "q2". Therefore a rising edge register is inferred after elaboration.

Figure 4B:
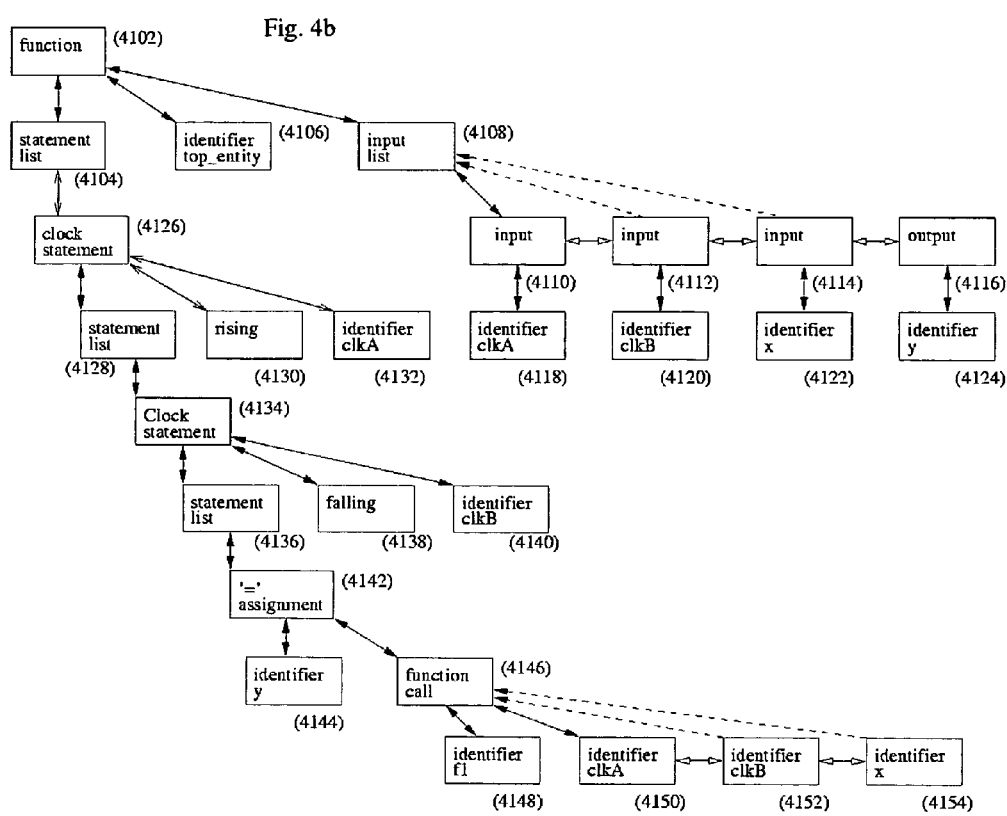
FIG. 4b shows a representation of the "top_entity" function in FIG. 4a as a tree structure.
Figure 4C:
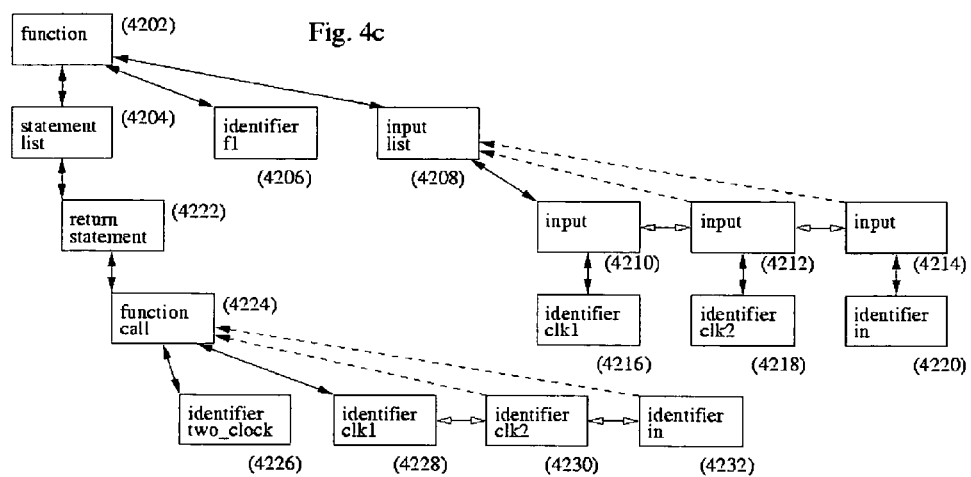
FIG. 4c shows a representation of the "f1" function in FIG. 4a as a tree structure.
Figure 4D:
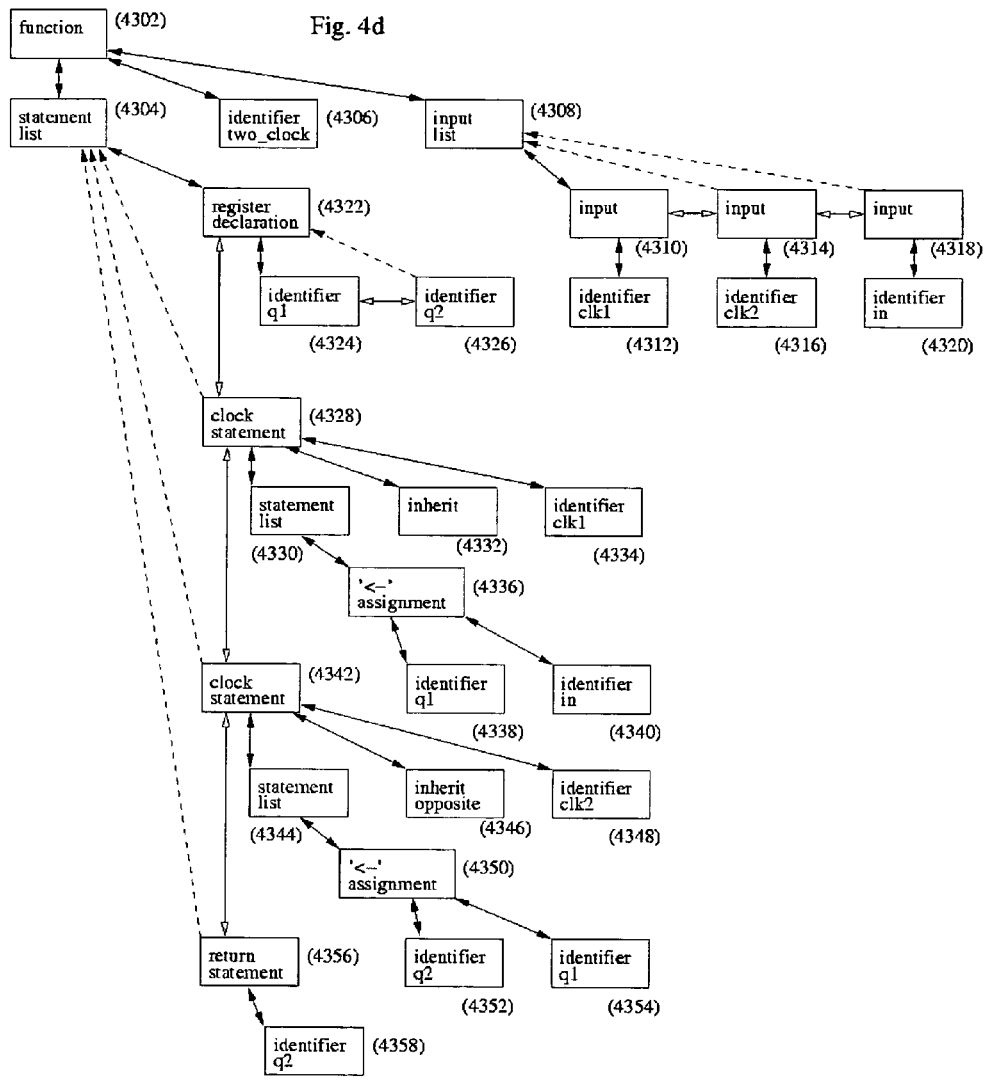
FIG. 4d shows a representation of the "two_clock" function in FIG. 4a as a tree structure.

The HDL code of FIG. 4a is represented by the node trees of FIGS. 4b through 4d. The notation in these figures is described in the legend shown in FIG. 4e. The function hierarchy starting at "top_entity" of FIG. 4a can be interpreted as equivalent to the circuit diagram of FIG. 4f. In FIG. 4f, the registers (4502) and (4504) represent the respective register declarations of "q1" and "q2" in the following single-line excerpt from function (4006) in FIG. 4a:
register q1, q2;

FIG. 4a—Elaboration Processing with the Search Algorithm

The following describes how exemplary elaboration processing (that incorporates the search algorithm) traverses the source code of FIG. 4a. While traversal can also be described in terms of corresponding node traversal in FIGS. 4b through 4d, it is easier to introduce concepts using just FIG. 4a. The node trees are actually referred to later in an alternative and more detailed description.

When elaboration starts at function "top_entity" of FIG. 4a, it enters context "rising clkA" as the first statement in the function's body of code. This statement controls the statement following its "context" reserved word. This statement is a nested clock statement "falling clkB". Within the nested statement, a call to an intermediate function "f1" occurs. "f1" does nothing except call the function "two_clock", and pass its connections from its caller to the function it calls.

To support the search algorithm, at each of the above calls:

(1) a backtrace from the called function to the calling expression is formed, and (2) dynamic binding of their connections occurs at the function call interface.

Continuing with the elaboration of function "two_clock", its first statement is elaborated first. This statement is a clock context with a directly inherited edge. The search algorithm is then started according to the invention, with signal "clk1" as the reference clock.

In the example, the start clock context has no controlling clock context, so the search continues up into function "f1". The call to "f1" also has no controlling clock context, so the search goes up to function "top_entity". There, the call to "f1" has a parent clock context with attributes "falling clkB". However signal "clkB", when traced through corresponding call parameters, connects to "clk2", not "clk1", which is not the same clock signal. The search therefore continues to find the next controlling clock context, which has an associated "rising" edge and clock signal "clkA". This clock signal is connected to the reference clock "clk1", so the found clock context is an appropriate controlling clock context. The start clock context is a directly inherited type, and the found context has an associated absolute rising edge. Therefore the derived active clock edge in the start context is established as a rising edge, and a rising edge replaces the direct inherited edge associated with the start context.

Having finished processing the first clock context in function "two_clock" (4006) of FIG. 4a, elaboration continues to the next statement which is an "inherit opposite" clock context. The signal "clk2" becomes the new reference clock. The elaboration also searches up according to the invention, as with the other clock context search. This time, in the function "top_entity", the search finds that the clock signal "falling clkB" is connected to the reference clock, so the absolute falling clock context is inherited. The start context is an "inherit opposite" type, so the opposite of the inherited falling edge is a derived active rising edge. Therefore an absolute rising edge replaces the oppositely inherited edge associated with the start context.

In real designs, the inherited clock edges used in a function hierarchy are controlled by an absolute clock context associated with each clock signal at a higher level in a design. In the example, the function "f1" doesn't even have to define any clock contexts for it to be able to participate in a function hierarchy that uses inherited clock contexts. Thus the invention allows hierarchies of functions to be designed with any number of clock signals. Furthermore, and ideally at the top function of a design, each clock signal can be defined as having any type of absolute active edge. This allows functions and hierarchies of functions to be written for use in a heterogeneous variety of clocked circuit designs.

FIGS. 4*b*,4*c*,4*d*—Node Tree Elaboration Processing

The clock context searches from the two inherited clock contexts of function "two_clock" (4006) of FIG. 4*a* are now described in detail using the node trees of FIGS. 4*b* through 4*d*. In the figures, nodes are represented by rectangular boxes, and relationships between nodes are indicated using arrows.

Figure 4E:
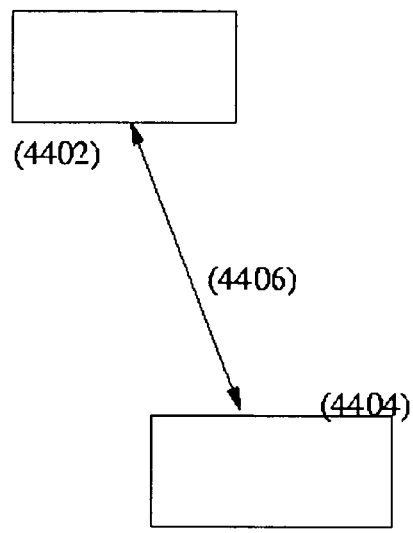
FIG. 4e is a decoding legend for FIGS. 4b through 4d inclusive.
Figure 4E:
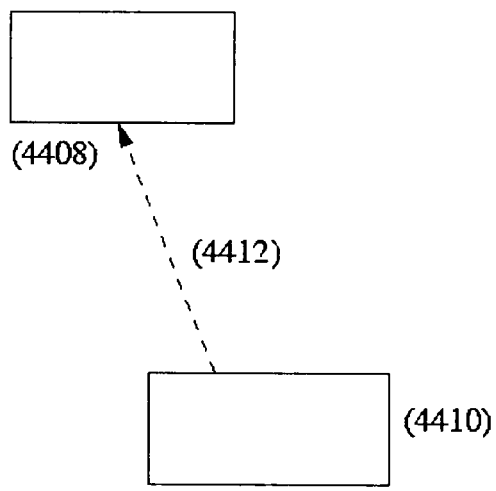
Figure 4E:
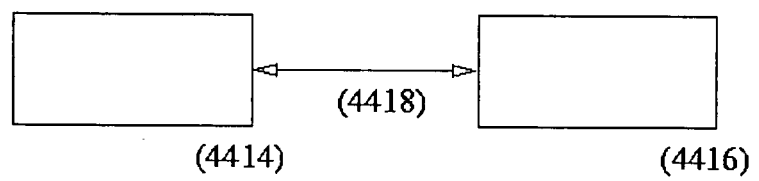
Figure 4F:
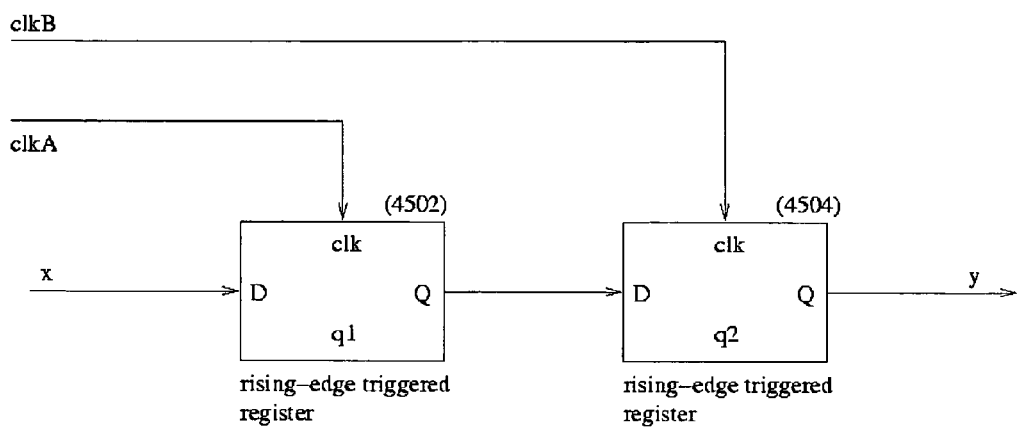

FIG. 4*e* is a legend for FIGS. 4*b*, 4*c*, and 4*d*. FIG. 4*e* illustrates the basic node relationship types. These types are differentiated using the following arrow types:

(1) A solid line with a double-ended solid arrow (4406) indicates that a parent node (4402) (the upper node as it appears in the figure) references a child node (4404) (the lower node), and the child node also references its single parent node.

(2) A single-ended dashed line and solid arrow (4412) indicates that a child node (4410) contains a reference to its parent node (4408). However, the parent node doesn't reference the child node.

(3) A solid line with a double-ended empty arrow (4418) between boxes at the same level indicates that two nodes (4414) and (4416) are sibling nodes, and each has a reference to the other.

When a search is at a particular node, an arrow pointing to another node allows the algorithm to easily and rapidly access the data in that other node. In some cases, a parent node controls a list of sibling nodes. In this case, ideally the parent node references the first sibling only, and then that sibling references its other siblings using an empty arrow. The use of one child to represent a list under a parent node allows a parent node to control an unrestricted number of child nodes, without it needing to store an unlimited number of child node references. Ideally, each node after the first in a sibling list should reference its parent using relationship type (2) above.

Elaboration starts at FIG. 4*b*, at the top level node (4102), and moves down to a statement list node (4104). The statement list has only one controlled statement, the clock statement at node (4126). Node (4126) has a child node (4130) that represents a rising clock edge. This is an absolute clock edge, so no clock inherit search is started. Execution of its controlled statement list (4128) starts. This elaborates the first (and only) statement, which is another clock statement (4134). Node (4134) has an associated absolute falling clock context (4138). Statement list node (4136) under the control of node (4134) is then elaborated. This node references the first (and only) statement (4142) which is an equals assignment. An assignment first evaluates the expression node on the right side of the "=" (4146), and then assigns or connects the result to the expression "y" (4144) on its left.

Expression (4146) is elaborated. It is found to be a function call node type. The function call identifies the function being called as "f1" in its child node (4148). The call uses previously found binding references to obtain the top level node of "f1" as (4202) in FIG. 4*c*. A backtrace reference from (4202) to (4146) is created. The function call also connects the "clkA" (4150), "clkB" (4152), and "x" (4154) identifiers to those in the called function at nodes "clk1" (4216), "clk2" (4218), and "in" (4220) respectively. Connection is established by binding of nodes at (4216), (4218) and (4220) to the declarations of their respective wires at nodes (4118), (4120), and (4122) respectively.

The function "f1" in FIG. 4*c* is now entered and elaborated at (4202).

The "f1" function's statement list node (4204) has a child node (4222) which is a "return" statement. The return statement contains an expression (4224) as a child node. This expression is evaluated, and the value is returned back to the caller of "f1" at node (4146) in FIG. 4*b*. The expression node (4224) in FIG. 4*c* is actually a function call. It calls function "two_clock" (4302) in FIG. 4*d*, connecting "clk1" (4228), "clk2" (4230), and "in" (4232) to the identifiers "clk1" (4312), "clk2" (4316), and "in" (4320) respectively. The function call also forms a backtrace reference from (4302) to (4224). Connection also involves dynamically binding (4312), (4316) and (4320) to the declarations of their respective wires at the highest level at nodes (4118), (4120) and (4122) in FIG. 4*b*.

The function "two_clock" in FIG. 4*d* is now entered and elaborated at (4302).

Elaboration references the child statement list (4304). Node (4304) in turn references its child which is a register declaration (4322). Register declarations declare identifiers "q1" and "q2" as register types. Elaboration then continues to the next statement from (4322), using its sibling reference. This reference goes to the clock context statement of (4328). This statement has an associated "inherit" active edge as its child node (4332), so the search algorithm is initiated.

Using the algorithm described in FIG. 3, the search node, and the start context (304) are both set to reference the clock context node (4328). Target clock context (306) is set to reference the identifier node "clk1" (4334) associated with the start context node (4328). Next, the parent node of the search node (4328) is found (308). It exists as node (4304), so (310) goes to (312) and the search node becomes the parent node (4304). The parent node is not a clock context type, so (314) goes back to (308). This loop of (308) to (310) to (312) to (314) and back to (308) continues up the node tree to each successive parent until either a parent node does not exist (308) or a clock context node is found (314). In this case, no clock context is found, and the parent node does not exist (it is conventionally referred to as a null reference) when the search reaches node (4302). In this case, the algorithm goes from step (310) to (320).

At (320), the backtrace obtained earlier at the call to (4302) is then used to obtain the node (4224) in FIG. 4*c*. The algorithm then goes on to step (322). The caller node exists, so (322) goes to (326), setting the search node to (4224), and returning to step (308). The search up the tree of FIG. 4*c* continues until the search node becomes (4202). The parent of (4202) does not exist, so (310) goes to (320). The backtrace from (4202) established earlier gives the call node as node (4146) in FIG. 4*b*. The call node exists, so (322) goes to step (326), setting the search node to (4146).

Now searching in FIG. 4*b* up from node (4146), step (326) goes to (308), continuing the main search loop up the tree to (310) to (312) to (314) and back to (308). At node (4134), the search node is a clock context statement, so at (314), the main search loop breaks out to step (316). The clock signal associated with (4134) is its child node "clkB" (4140). The target clock "clk1" (4334) in FIG. 4*d* was bound earlier to node "clkA" (4118). The signal "clkA" is not connected to node "clkB" found at (4140), so (318) goes back to continue the main search loop at (308).

As described previously, the main search loop then continues up the tree from (4134) until it reaches another clock statement node at (4126). The main search loop then breaks out as (314) goes to (316). The clock signal associated with node (4126) is its child node "clkA" (4132). The clock signal "clk1" at node (4334) was previously bound to the same object as referenced by "clkA", so they are connected and (318) goes to (328). The found clock edge becomes the associated "rising" edge of child node (4130) of the found clock context (4126). The start context at node (4328) is defined as an "inherit" type at its child node (4332). Therefore (330) goes to step (332), and sets the derived clock edge value to the found clock edge value, which is a rising clock edge.

The node "inherit" (4332) can now be changed to a rising edge node at step (336), as elaboration occurs on a node tree that is cloned from the original input tree. Subsequent elaborations of the function at node (4302) work from node trees cloned from the original template, so they will have the original inherited edge type at node (4332), and will again perform a search when the node at (4328) is encountered. The outcome of each search depends on what calls function "two_clock" (4006), allowing that function to adapt to its environment.

Now that the search from node (4328) is finished, elaboration of the statements controlled by (4328) under node (4330) can continue. The controlled assignment (4336) of wire "in" (4340) to the register "q1" (4338) can later be inferred as a rising edge triggered register. Having elaborated all controlled statements under (4330), elaboration at the sibling of (4328) continues at node (4342). Node (4342) is also a clock statement, so a search starts as with (4328). This time, the target clock signal is child node "clk2" (4348). The search, according to the algorithm of FIG. 3, yields a match at the clock context at the found node (4134), because "clk2" in FIG. 4*d* is connected to "clkB" in FIG. 4*b*.

The falling edge defined by the child node (4138) of the found node (4134), combined with the associated "inherit opposite" child node (4346) of the start context at node (4342), yields a derived rising clock edge. The controlled clocked register assignment at node (4350) assigns the output of register "q1" (4354) to the input of register "q2" at node (4352). A rising edge register can thereby be inferred in later processing. The output of register "q2" is obtained in the expression (4358), and returned from the function at its parent node (4356). The output is connected to the returned value of the function call expression (4224) in FIG. 4*c*. In turn, this output is connected to the return of the function call expression (4146) in FIG. 4*b*. Finally, this output signal (4146) is assigned (4142) or connected to node "y" (4144). The node "y" is a signal connected to the output node "y" (4124) of the function "top_entity".

Accommodating the Search Algorithm

The search algorithm described in FIG. 3 uses references and performs actions that are applicable to any function or function hierarchy where functions are represented as node trees. It is apparent from the earlier descriptions that for the search algorithm of FIG. 3 to operate on a node tree, the following accommodations are required:

(1) The node tree that corresponding to a function is cloned on each call to the function. The cloning occurs prior to entering the function during elaboration processing. Cloning always leaves one copy of the original unmodified node tree to be used for further cloning in subsequent function calls.

(2) Whenever a function calls another function, a backtrace reference is created from the called function to the call node in the calling function. The backtrace reference is created prior to entering the function during elaboration processing.

(3) It must be possible to test whether two named clock signals are actually connected together. This test must also work with connections that are dynamically created when one function calls another.

Furthermore, the following node features are conventionally provided in node trees, and are particularly required by the search algorithm:

(a) Each node within a node tree must have an associated node type, (b) Clock context node types must have associated clock signal and edge information, (c) Unless at the top of a node tree, each node within a node tree must ideally have a parent reference.

CONCLUSIONS, RAMIFICATIONS, AND SCOPE OF INVENTION

Thus the reader will see that the search algorithm of the invention, when incorporated into language translation tools, allows functions to adapt to an active clock edge defined at a higher level in a function hierarchy. Conventional languages only allow clock contexts that define active clock edges as fixed, absolute types. Furthermore, the invention allows the use of directly inherited or oppositely inherited clock contexts. The algorithm is able to search for a controlling clock context anywhere up into a function hierarchy. The active clock edge can be specified as an absolute edge at the top level function of a design hierarchy. This allows a design to be used with a different clock edge simply by changing an absolute edge specified in just one place in source code. The invention can also support designs with multiple clock signals.

The invention, when incorporated correctly into HDL translation tools, allows functions to adapt to a wider range of calling environments. This adaptation increases the ease with which functions can be reused compared with the conventional limitation of using only clock contexts with absolute edges. Reuse increases the productivity of circuit designers by reducing the amount of source code they write, and thereby reduces errors. Reuse allows accumulation of valuable intellectual property, and easier deployment of this property in future products. These factors lead to an increase in competitiveness in a world where even modest reductions in time-to-market are rewarded.

While my above description contains many specificities, these should not be construed as limitations on the scope of the invention, but rather as an exemplification of one preferred embodiment thereof. Other variations are possible. For example, existing HDL languages and tools can be adapted to use the invention, or new HDL languages and tools can be designed to use it from the start. With simple modifications, the invention can be used in HDLs that do not support recursion, such as Verilog. The invention can even be used with HDLs that have no processing stage that is identified as elaboration processing.

Accordingly, the scope of the invention should be determined not by the embodiment illustrated, but by the appended claims and their legal equivalents.

I claim:

1. A method of deriving an absolute clock edge to be used when an inherited clock context is encountered in HDL source code that is input to a translation tool, comprising:
   (a) providing a tokenizer means,
   (b) providing source code that comprises an HDL function and which said tokenizer partitions into a sequence of tokens,
   (c) providing a parser means which:
      (1) converts said sequence of tokens for the function into a representation of said function as a tree of nodes, wherein each node comprises storage for a value identifying a node type and storage for a plurality of node references, and wherein the storage for the references and node types are set by said parser in order to form the node tree, and
      (2) represents an inherited clock context within said HDL function as a clock context node within said node tree, with an associated clock signal and an associated inherited clock edge or inherited edge,
   (d) performing elaboration processing which traverses said node tree using said node references, and which comprises performing an inheritance search if the processing encounters a clock context node with an associated inherited edge,
   (e) starting said inheritance search from the encountered node or search node and moving up said node tree from said search node using said node references until a higher controlling clock context node or controlling node is found,
   (f) obtaining a found clock edge associated with the found controlling node,
   (g) obtaining a derived edge for said search node, said derived edge being an absolute edge, and the derivation using said found clock edge and said inherited edge associated with said search node,
   whereby an inherited clock context can direct subsequent processing of statements under its control in order to instantiate storage elements with state changes that occur on the clock context's derived edge, and
   whereby functions that use inherited clock contexts can be used in circuit designs selected from the group of rising edge and falling edge and both edges.

2. The method of claim 1 wherein said inherited edge is selected from the group consisting of directly inherited and oppositely inherited.

3. The method of claim 1 wherein said absolute edge is selected from the group consisting of rising edge and falling edge and both edges.

4. The method of claim 1 wherein said references comprise a parent reference, a child reference, and a sibling reference.

5. The method of claim 1 further including searching for the first controlling node that also has an associated clock signal that is connected to the clock signal associated with said search node, thereby allowing a plurality of clock signals to be used within a function.

6. The method of claim 1 further including replacing the inherited edge with the derived edge as the absolute edge associated with said search node, whereby any subsequent inheritance searches under the control of said search node can then find the associated absolute edge.

7. The method of claim 1 further including calling one function by another, such that if said inheritance search reaches the top of the node tree corresponding to the called function, then the inheritance search can continue up from the calling node within the caller function's node tree representation, thereby allowing a function to inherit absolute edges from its callers.

8. A data processing system for searching for an absolute clock edge to be used when an inherited clock context is encountered in HDL source code that is input to a translation tool, comprising:
   (a) tokenizer means that converts source code that comprises an HDL function into a sequence of tokens,
   (b) parser means which:
      (1) converts said sequence of tokens for the function into a representation of said function as a tree of nodes, wherein each node comprises storage for a value identifying a node type and storage for a plurality of node references, wherein the storage for the references and node types are set by said parser in order to form the node tree, and
      (2) represents an inherited clock context within said HDL function as a clock context node within said node tree, with an associated clock signal and an associated inherited clock edge or inherited edge,
   (c) an elaboration processor which traverses said node tree using said node references, and which comprises a means for performing an inheritance search if processing encounters a clock context node with an associated inherited edge,
   (d) a means for performing said inheritance search from the encountered node or search node, the search moving up said node tree from said search node using said node references until a higher controlling clock context node or controlling node is found,
   (e) a means for obtaining a found clock edge associated with the found controlling node,
   (f) a means for deriving an absolute clock edge or derived edge for said search node, the deriving means using said found clock edge and said inherited edge associated with said search node,
   whereby said inherited clock context can direct subsequent processing of statements under its control in order to instantiate storage elements with state changes that occur on the clock context's derived edge, and
   whereby functions that use inherited clock contexts can be used in circuit designs selected from the group of rising edge and falling edge and both edges.

9. The means of claim 8 wherein said inherited edge is selected from the group consisting of directly inherited and oppositely inherited.

10. The means of claim 8 wherein said absolute edge is selected from the group consisting of rising edge and falling edge and both edges.

11. The means of claim 8 wherein said references comprise a parent reference, a child reference, and a sibling reference.

12. The means of claim 8 further including a means for searching for the first controlling node that also has an associated clock signal that is connected to the clock signal associated with said search node, thereby allowing a plurality of clock signals within a function.

13. The means of claim 8 further including a means for replacing the inherited edge with the derived edge as the absolute edge associated with said search node, whereby any subsequent inheritance searches under the control of said search node can then find the associated absolute edge.

14. The means of claim 8 further including a means for calling one function by another, such that if said inheritance search reaches the top of the node tree corresponding to the called function, then the inheritance search can continue up from the calling node within the caller function's node tree representation, thereby allowing a function to inherit absolute edges from its callers.

* * * * *